United States Patent [19]

Tara et al.

[11] Patent Number: 5,196,370
[45] Date of Patent: Mar. 23, 1993

[54] METHOD OF MANUFACTURING AN ARSENIC-INCLUDING COMPOUND SEMICONDUCTOR DEVICE

[75] Inventors: Katsushi Tara; Toshiharu Tambo, both of Kyoto; Kaname Motoyoshi, Osaka; Hidetaka Hashimoto; Shotaro Umebachi, both of Kyoto; Susumu Koike, Osaka, all of Japan

[73] Assignee: Matsushita Electronics Corporation, Osaka, Japan

[21] Appl. No.: 789,283

[22] Filed: Nov. 8, 1991

[30] Foreign Application Priority Data

Nov. 8, 1990 [JP] Japan ............................. 2-304350

[51] Int. Cl.⁵ .......................................... H01L 21/266
[52] U.S. Cl. ......................................... 437/161; 437/22; 437/934
[58] Field of Search .................. 437/22, 25, 160, 161, 437/934, 987; 148/DIG. 3, DIG. 15, DIG. 34, DIG. 65, DIG. 84

[56] References Cited

U.S. PATENT DOCUMENTS 4,472,206  9/1984  Hodgson et al. ...................... 437/22
4,824,798  4/1989  Burnham et al. ..................... 437/987

FOREIGN PATENT DOCUMENTS 0043415  3/1982  Japan ................................. 437/22
0137823  6/1987  Japan ................................ 437/161
0116421  5/1988  Japan ................................. 437/22

Primary Examiner—Brian E. Hearn
Assistant Examiner—C. Chaudhari
Attorney, Agent, or Firm—Ratner & Prestia

[57] ABSTRACT

This invention relates to a method of manufacturing an Arsenic-including compound semiconductor device comprising the steps of forming an ion implantation layer in a specified region of an As compound semiconductor wafer, forming an As layer on the surface of the wafer, and annealing the wafer. In this manner, As evaporation in the ion implantation layer by annealing heat may be prevented. Accordingly, sufficient substitution of the implanted ions and the ions other than As ions composing the As compound may be achieved, thereby preventing lowering of the electrical activation of the As compound semiconductor device. In addition, the electrical activation becomes uniform over the whole area of the water.

6 Claims, 3 Drawing Sheets

FIG. IA
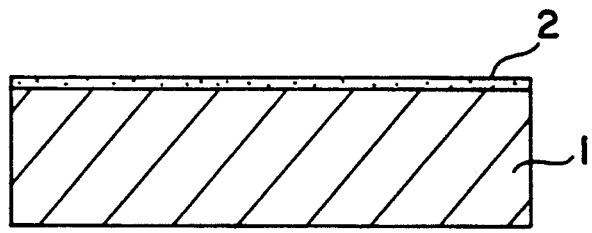
FIG. IB
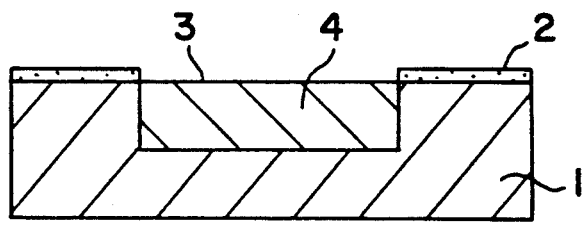
FIG. IC
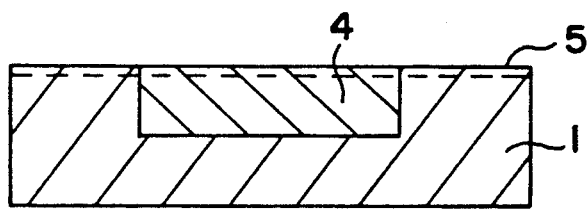
FIG. ID
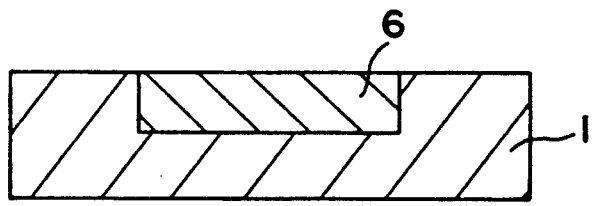
FIG. IE
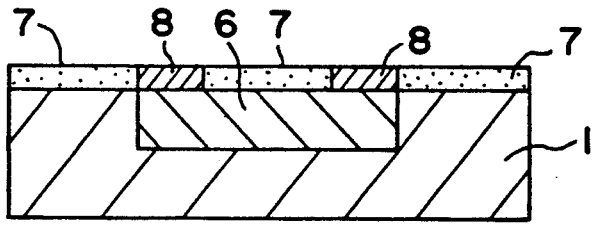

METHOD OF MANUFACTURING AN ARSENIC-INCLUDING COMPOUND SEMICONDUCTOR DEVICE

BACKGROUND OF THE INVENTION

The present invention relates to a method of manufacturing an Arsenic-including compound semiconductor device so that uniform electrical activation is obtained over the whole of the slice.

Generally, in a semiconductor device of an As compound wafer, such as GaAs wafer, it is necessary to implant silicon ions (or the like) into the wafer to form an active layer. When forming an active layer, in order to promote the substitution of arsenic ions in the wafer for the implanted silicon ions, high temperature treating (so-called annealing) is needed. At this time, since the evaporation temperature of arsenic is lower than that of gallium, the arsenic ions in the wafer surface are evaporated by the annealing heat, which leads to a reduction of the electrical activation.

Usually, therefore, after ion implantation, the wafer is annealed in an atmosphere containing arsenic at a pressure of 1 or 2 Torr. This pressure is called the As overpressure. Evaporation of arsenic may be prevented by setting this As overpressure higher than the pressure to prevent As evaporation (the pressure at which As begins to be decomposed from the wafer).

A method is also known for forming a cap composed of silicon oxide film and plasma nitride film on the surface of a wafer, and preventing As evaporation during annealing by this method.

In the method of applying the As overpressure, however, it is difficult to supply the gas containing As uniformly on the whole area of the slice surface. Yet, the arsenic does not evaporate uniformly over the slice surface. Rather, the arsenic intensifies the dislocation. Owing to such difficulty in control of gas flow rate and nonuniformity of As evaporation distribution, it is extremely difficult to prevent evaporation of arsenic uniformly over the whole area of the slice.

On the other hand, in the encapsulation method of the wafer surface with silicon oxide film or plasma nitride film for the passivation of GaAs wafer, the evaporation of As becomes nonuniform due to properties of these films (quantity of hydrogen in the film, presence of pinholes, etc.), so that the electrical activity becomes nonuniform.

It is hence a primary object of the invention to present a method of manufacturing an Arsenic-including compound semiconductor device capable of solving such conventional problems.

SUMMARY OF THE INVENTION

To achieve the above object, the invention presents a method of manufacturing an Arsenic-including compound semiconductor device comprising the steps of forming an ion implantation layer in a specified region of an As compound semiconductor wafer, forming an As layer on the surface of the wafer, and annealing the wafer.

The invention also presents a method of manufacturing an Arsenic-including compound semiconductor device comprising the steps of forming an ion implantation layer in a specified region on the surface of an As compound semiconductor wafer, forming As layers on the surface of the wafer, covering the surface with a cap made of oxide film or nitride film, and annealing the wafer.

In this manner, As evaporation in the ion implantation layer by annealing heat may be prevented. Accordingly, substitution of the implanted ions and the ions other than As ions composing the As compound may be sufficiently performed, thereby preventing lowering of the electrical activation of the As compound semiconductor device. In addition, the electrical activation becomes uniform over the whole area of the wafer.

BRIEF DESCRIPTION OF THE DRAWINGS

FIG. 1A to FIG. 1E are process sectional views showing a method of manufacturing an Arsenic-including compound semiconductor device in a first embodiment of the invention;

DETAILED DESCRIPTION OF THE INVENTION

Figure 2A:
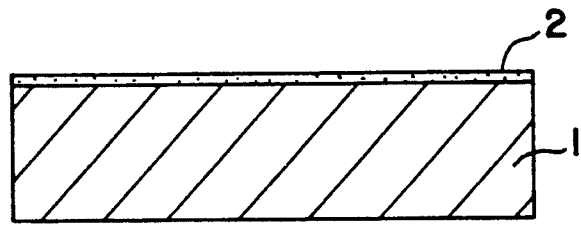
FIG. 2A to FIG. 2E are process sectional views showing a method of manufacturing an Arsenic-including compound semiconductor device in a second embodiment of the invention.
Figure 2B:
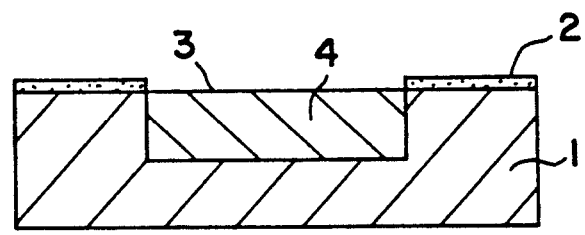

Referring now to the drawings, several embodiments of the invention are described in detail below.

FIG. 1A to FIG. 1E are process sectional views showing a method of manufacturing an Arsenic-including compound semiconductor device according to a first embodiment of the invention.

First, as shown in FIG. 1A, an oxide film 2 is formed on the surface of a GaAs wafer 1 to be used as a mask at the time of ion implantation.

Next, as shown in FIG. 1B, a window 3 for ion implantation is opened in a part of the oxide film 2, and silicon ions are implanted into the wafer 1 through this window 3. As a result, a silicon ion implantation layer 4 is formed in the wafer 1.

Afterwards, the oxide film 2 for ion implantation is removed. In this state, the As ions and Ga ions are neatly arranged inside the wafer 1. Up to this step, the embodiments of the present invention and the conventional manufacturing method include similar steps.

Next the wafer 1 is dipped in a phosphate solution, and Ga ions near the surface of the wafer 1 are dissolved in the phosphate solution. As a result, the surface of the wafer 1 forms an As layer 5 containing a plurality of As ions in a thickness of many (i.e. 10–100) angstroms.

After thus forming the As layer 5 on the surface of the wafer 1, the wafer 1 is treated at high temperature (annealed). Due to the annealing heat, Ga ions in the ion implantation layer 4 are replaced by silicon ions, and an active layer 6 is formed.

In this process, the As ions in the As layer 5 are evaporated by the annealing heat, and at the end of annealing, the As layer 5 is lost as shown in FIG. 1D, while As in the ion implantation layer 4 is hardly evaporated. Accordingly, the electrical activation of the active layer 6 is not lowered. In addition, since the As layer 5 is formed on the whole surface of the wafer 1, nonuniformity of the electrical activity may be improved at the same time.

Next, as shown in FIG. 1E, a protective film 7 composed of oxide film, nitride film or the like is formed on the surface of the wafer 1, and a window is formed. In this window, an electrode 8 is formed, and by ohmic contact of this electrode 8 and the active layer 6, GaAs Hall elements may be realized.

FIG. 2A to FIG. 2E are process sectional views showing a method of manufacturing an Arsenic-including compound semiconductor device in a second embodiment of the invention. In FIG. 2A to FIG. 2E, identical parts as in FIG. 1A to FIG. 1E are identified with identical reference numbers.

FIG. 2A to FIG. 2E differs from FIG. 1A to FIG. 1E as follows.

Figure 2C:
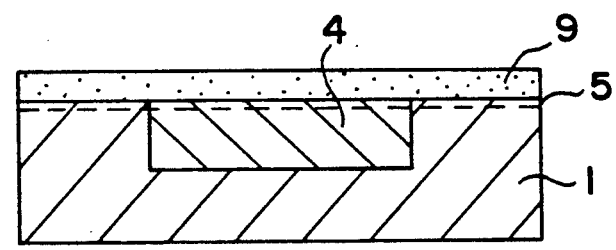
Figure 2D:
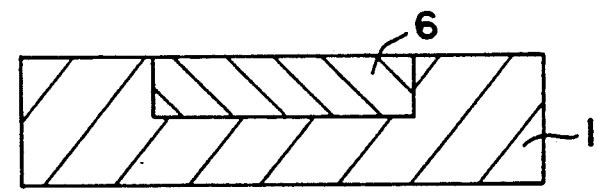
Figure 2E:
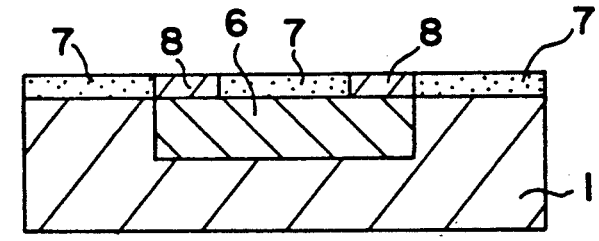

As shown in FIG. 2C, after forming an As layer 5 on the surface of a wafer 1, the surface is covered with a cap 9 composed of silicon oxide film, plasma nitride film or the like, and annealing is applied in this state. Thus, As evaporation by the annealing heat is inhibited by the cap 9. As a result, the electrical activation is further heightened, and the nonuniformity of electrical activation is much improved.

Figure 3A:
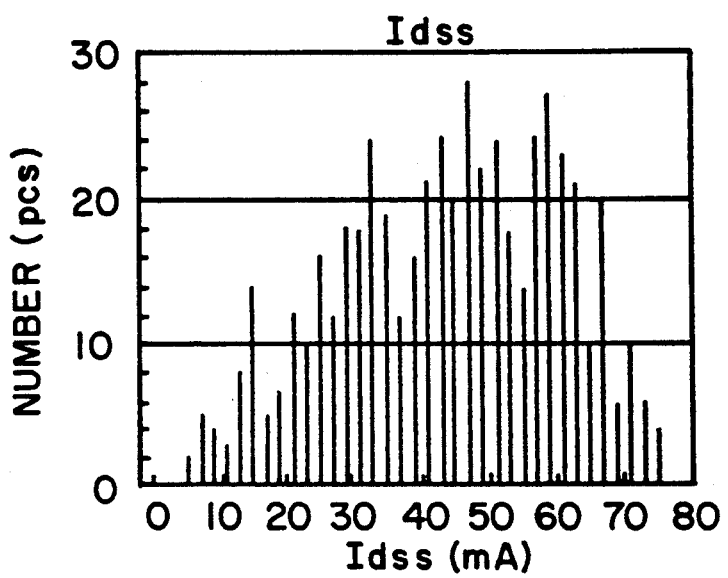
FIG. 3A and FIG. 3B are diagrams showing the results of measurement for explaining the difference in effects between the prior art and an exemplary embodiment of the invention.
Figure 3B:
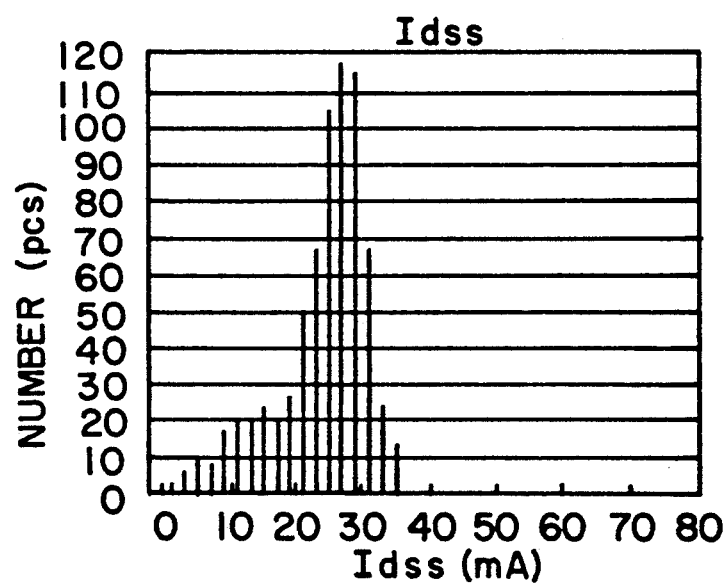

A comparison of FIG. 3A and FIG. 3B illustrates a difference in the effects between the first embodiment of the invention and the prior art. In these figures, the drain-source current (Idss [mA]) is measured at predetermined points on the slice, and the number of points (Number [pcs]) having each drain source current is plotted on the axis of ordinates.

As shown in FIG. 3A, in a slice manufactured according to the conventional method, the drain-source current fluctuates widely.

By contrast, as shown in FIG. 3B, in a slice manufactured according to the method of the first embodiment of the invention, the fluctuations of the drain-source current are small, and the values are concentrated around 20 to 30 mA.

It is known from FIG. 3A and FIG. 3B that the electrical activity may be improved in uniformity by forming the As layer 5 on the surface of the wafer 1 prior to annealing.

In the foregoing embodiments, a semi-insulating GaAs wafer is presented for explanation, but any other As containing compound wafer may be similarly used.

Alternatively, instead of dissolving Ga by using phosphate solution as presented in the foregoing embodiments, any other solution may be also used which is capable of dissolving elements other than As in the As compound. For example, the slice may be immersed in hydrofluoric acid for about 30 to 40 minutes to dissolve elements other than arsenic.

Incidentally, when the slice is washed in water after forming an As layer 5 by immersing the slice in a solution of phosphoric acid, hydrofluoric acid or the like, the properties of the slice may be varied depending on the immersion time in water because the As compound is hydrophilic. Therefore, after forming the As layer 5, it is desirable to dry the slice in a gaseous environment. In this manner, the fluctuation of slice properties may be smaller, and an As compound semiconductor device of a superior uniformity may be obtained.

What is claimed is:

1. A method of manufacturing an Arsenic-including compound semiconductor device, comprising:
    step a) forming an ion implantation layer in a specified region on an As compound semiconductor wafer,
    step b) treating the As compound semiconductor wafer with a solution in a wet process for dissolving elements other than As to form an As layer containing As on the surface of the As compound semiconductor wafer, and
    step c) heating the As compound semiconductor wafer on which the As layer is formed, such that the ion implantation layer is modified into an active layer.

2. A method of manufacturing an Arsenic-including compound semiconductor device according to claim 1, wherein the solution in the wet process is one of hydrofluoric acid and phosphoric acid.

3. A method of manufacturing an Arsenic-including compound semiconductor device according to claim 1, wherein the As compound semiconductor wafer is dried in a gas after the wet process.

4. A method of manufacturing an Arsenic-including compound semiconductor device comprising:
    step a) forming an ion implantation layer in a specified region on an As compound semiconductor wafer,
    step b) treating the As compound semiconductor wafer with a solution in a wet process for dissolving elements other than As to form an As layer on the surface of the As compound semiconductor wafer,
    step c) forming a cap on the surface of the As layer,
    step d) heating the As compound semiconductor wafer having the cap formed on the surface of the As layer, such that the ion implantation layer is modified into the active layer, and
    step e) removing the cap.

5. A method of manufacturing an Arsenic-including compound semiconductor device according to claim 5, wherein the solution in the wet process is one of hydrofluoric acid and phosphoric acid.

6. A method of manufacturing an Arsenic-including compound semiconductor device according to claim 4, wherein the As compound semiconductor wafer is dried in a gas after the wet process.

* * * * *

UNITED STATES PATENT AND TRADEMARK OFFICE
CERTIFICATE OF CORRECTION

PATENT NO. : 5,196,370
DATED : March 23, 1993
INVENTOR(S) : Tara et al.

It is certified that error appears in the above-identified patent and that said Letters Patent is hereby corrected as shown below:

At column 4, line 46, delete "claim 5" and insert therefor --claim 4--.

Signed and Sealed this

First Day of November, 1994

Attest:

BRUCE LEHMAN

*Attesting Officer*   *Commissioner of Patents and Trademarks*